US011183991B2

(12) United States Patent
Stroh

(10) Patent No.: US 11,183,991 B2
(45) Date of Patent: Nov. 23, 2021

(54) DYNAMIC CONNECTION NODE BASED COMPUTING

(71) Applicant: Parker Wilde Stroh, Hampton (AU)

(72) Inventor: Parker Wilde Stroh, Hampton (AU)

( * ) Notice: Subject to any disclaimer, the term of this patent is extended or adjusted under 35 U.S.C. 154(b) by 0 days.

(21) Appl. No.: 16/387,794

(22) Filed: Apr. 18, 2019

(65) Prior Publication Data

US 2019/0326892 A1    Oct. 24, 2019

(30) Foreign Application Priority Data

Apr. 18, 2018 (AU) .................................. 2018901289

(51) Int. Cl.
*G06F 13/12* (2006.01)
*H03K 5/02* (2006.01)
*G06N 3/04* (2006.01)
*H03K 5/00* (2006.01)

(52) U.S. Cl.
CPC ............... *H03K 5/02* (2013.01); *G06N 3/04* (2013.01); *H03K 5/00006* (2013.01); *H03K 2005/00286* (2013.01)

(58) Field of Classification Search
CPC ...................... G06F 13/00; H03K 5/02; H03K 2005/00286; G06N 3/04; H93K 5/00006
USPC .................................... 710/65, 20, 29, 36, 45
See application file for complete search history.

(56) References Cited

U.S. PATENT DOCUMENTS

| | | | | |
|---|---|---|---|---|
| 6,392,769 B1* | 5/2002 | Ford et al. | ............ | H04W 24/08 455/424 |
| 2003/0091022 A1* | 5/2003 | Blanz | ................ | H04W 56/0015 370/350 |
| 2012/0163200 A1* | 6/2012 | Steinberger | ......... | H04L 12/2801 370/252 |
| 2017/0353975 A1* | 12/2017 | Khawer | ............ | H04W 74/0816 |

* cited by examiner

*Primary Examiner* — Tim T Vo
*Assistant Examiner* — Kim T Huynh
(74) *Attorney, Agent, or Firm* — Jason P. Mueller; FisherBroyles, LLP

(57) ABSTRACT

Described herein are nodes, sub-systems and systems of nodes for use in a dynamic node based computer. In some embodiments, nodes include: one or more signal receivers for detecting or receiving one or more input signals from one or more signal sources, one or more signal transmitters for selectively connecting and transmitting signals to one or more other nodes; and a threshold device configured to control the selective operation of the signal transmitter based on a threshold derived from one or more characteristics of the input signals. More complex variations of the nodes include the addition of threshold manipulation devices, signal amplifiers or dampeners, control devices, or computational devices. Also described herein are machines or devices built from one or more such nodes.

21 Claims, 11 Drawing Sheets

| (1,1) | (1,2) | (1,3) | (1,4) | (1,5) | (1,6) | (1,7) | (1,8) |
|---|---|---|---|---|---|---|---|
| (2,1) | (2,2) | (2,3) | (2,4) | (2,5) | (2,6) | (2,7) | (2,8) |
| (3,1) | (3,2) | (3,3) | (3,4) | (3,5) | (3,6) | (3,7) | (3,8) |
| (4,1) | (4,2) | (4,3) | (4,4) | (4,5) | (4,6) | (4,7) | (4,8) |
| (5,1) | (5,2) | (5,3) | (5,4) | (5,5) | (5,6) | (5,7) | (5,8) |
| (6,1) | (6,2) | (6,3) | (6,4) | (6,5) | (6,6) | (6,7) | (6,8) |
| (7,1) | (7,2) | (7,3) | (7,4) | (7,5) | (7,6) | (7,7) | (7,8) |
| (8,1) | (8,2) | (8,3) | (8,4) | (8,5) | (8,6) | (8,7) | (8,8) |

Figure 6

| (1,1) | (1,2) | (1,3) | (1,4) | (1,5) | (1,6) | (1,7) | (1,8) |
|---|---|---|---|---|---|---|---|
| (2,1) | (2,2) | *(2,3)* | (2,4) | (2,5) | *(2,6)* | (2,7) | (2,8) |
| (3,1) | (3,2) | (3,3) | (3,4) | (3,5) | (3,6) | (3,7) | (3,8) |
| (4,1) | (4,2) | (4,3) | (4,4) | (4,5) | (4,6) | (4,7) | (4,8) |
| (5,1) | (5,2) | (5,3) | (5,4) | (5,5) | (5,6) | (5,7) | (5,8) |
| (6,1) | *(6,2)* | (6,3) | (6,4) | (6,5) | (6,6) | *(6,7)* | (6,8) |
| (7,1) | (7,2) | *(7,3)* | *(7,4)* | *(7,5)* | *(7,6)* | (7,7) | (7,8) |
| (8,1) | (8,2) | (8,3) | (8,4) | (8,5) | (8,6) | (8,7) | (8,8) |

Figure 7

| (1,1) | (1,2) | (1,3) | (1,4) | (1,5) | (1,6) | (1,7) | (1,8) |
|-------|-------|-------|-------|-------|-------|-------|-------|
| (2,1) | (2,2) | (2,3) | (2,4) | (2,5) | (2,6) | (2,7) | (2,8) |
| (3,1) | (3,2) | (3,3) | (3,4) | (3,5) | (3,6) | (3,7) | (3,8) |
| (4,1) | (4,2) | (4,3) | (4,4) | (4,5) | (4,6) | (4,7) | (4,8) |
| (5,1) | (5,2) | (5,3) | (5,4) | (5,5) | (5,6) | (5,7) | (5,8) |
| (6,1) | (6,2) | (6,3) | (6,4) | (6,5) | (6,6) | (6,7) | (6,8) |
| (7,1) | (7,2) | (7,3) | (7,4) | (7,5) | (7,6) | (7,7) | (7,8) |
| (8,1) | (8,2) | (8,3) | (8,4) | (8,5) | (8,6) | (8,7) | (8,8) |

Figure 8

| D | D | D | D | D | D | D | D | D | D |
|---|---|---|---|---|---|---|---|---|---|
| D | D | D | D | D | D | D | D | D | D |
| D | D | D | Q | D | D | D | D | D | D |
| D | D | Q | G | Q | D | D | D | D | D |
| D | D | D | Q | D | D | Q | D | D | D |
| D | D | D | D | D | Q | G | Q | D | D |
| D | D | Q | D | D | D | Q | D | D | D |
| D | Q | G | Q | D | D | D | D | D | D |
| D | D | Q | D | D | D | D | D | D | D |
| D | D | D | D | D | D | D | D | D | D |

Figure 11

DYNAMIC CONNECTION NODE BASED COMPUTING

CROSS-REFERENCE TO RELATED APPLICATIONS

This application claims priority to Australian Patent Application No. 2018901289, filed Apr. 18, 2018, the entire contents of which is incorporated herein by reference.

FIELD OF THE INVENTION

This disclosure relates generally modular or dynamic computing, and in particular to computing including a series of interconnected nodes and/or sub-systems of nodes.

Disclosed embodiments have been particularly adapted for use in a neural emulating circuit board or chip. However, it will be appreciated that the invention is applicable in broader contexts.

BACKGROUND

Traditional computers based on binary transistors and even those using so called neuromorphic hardware (which utilize gaps between conducting elements filled with nano-clusters of magnetic manganese which may be aligned to point in different directions by altering the magnetic field in the gap and thus permitting the system to encode information in terms of the level of electricity and in the direction of magnetism) have two major problems: (1) they are unable to create or utilize randomness and (2) all connections between switches or elements are fixed in nature or physically pre-set and thus limited in how they may perform calculations. A computer based on all existing technologies, designs, or component formats has a set number of possible ways an electron or electron based signal may travel. Even quantum computers have this second limitation and it remains to be seen if they have overcome the first.

These two factors substantially limit the potential of traditional computers and circuit based hardware for "true" artificial intelligence (AI) applications. Human brains have the ability both to generate random events and radically change the physical connections within the brain between neurons, between collection of neurons operating as functional sub-systems, and between complex sub-systems comprised of collections of individual neurons and one or more functional sub-systems. The ability to generate effectively random events and the ability to both alter the characteristics of existing connections and create entirely new connections between neurons and sub-systems occurs constantly in the human brain. These characteristics are at least partially responsible for human intellect and our ability to create, invent, innovate, and solve novel problems.

This inability of traditional computer components to dynamically change how they are connected, the fixed physical connections between all elements at all scales, means that data flows and information have only fixed paths and so may not generate new information or truly learn. These limit machine learning to programmed optimization of pattern recognition, target result matching, and improved probability of outcome rather than true learning capable of delivering certainty even in conditions of partial information. This leaves attempts at true artificial intelligence as likely impossible using traditional computer designs.

SUMMARY OF THE INVENTION

According to a first aspect of the disclosure, there is provided a node for use in a dynamic node based computer, including:

a signal receiver for detecting or receiving one or more input signals from one or more signal sources, a signal transmitter for selectively connecting and transmitting the input signals to one or more other nodes; and a threshold mechanism to control the selective operation of the signal transmitter based on a threshold derived from one or more characteristics of the input signals.

In one or more embodiments, the characteristics of the input signals include any one or more of direction, intensity, amplitude, period, frequency, and waveform.

In one or more embodiments, the threshold is derived from one or more characteristics of the input signals of multiple input signals.

In one or more embodiments, the threshold mechanism dynamically adjusts the threshold based on the one or more characteristics of the input signals.

In one or more embodiments, the signal receiver is adapted to alter the direction from which input signals are received.

In one or more embodiments, the signal sources include input signals from one or more sensors and/or detectors, such as a light detector, color sensor, sound detector, chemical sensors, motion sensor and the like.

In one or more embodiments, the node further includes: an output stage for enabling connection of the transmitted signal to an external actionable or controllable device such as a motor, switch, computer or the like.

In one or more embodiments, the signal sources include transmitted signals from other nodes.

In one or more embodiments, the node further includes: a signal control device for dynamically altering one or more characteristics of the transmitted signal.

In one or more embodiments, the signal control device is adapted to dynamically alter any one or more of the direction, intensity, amplitude, period, frequency, and waveform of the transmitted signals. In some embodiments, the control device is adapted to dynamically alter a polarization of the transmitted signals. This may be achieved through one or more polarization modifying element such as a quarter-wave plate, half-wave plate, Faraday rotator, or polarization filter.

In one or more embodiments, the threshold device includes a minimum and a maximum threshold.

In one or more embodiments, the node includes a control mechanism configured to selectively adjust the threshold device. In one embodiment, the control mechanism is the signal control device. In another embodiment, the control mechanism is part of the threshold device.

In one or more embodiments, the node includes a dynamic amplifier operatively associated with the signal receiver. In one embodiment, the dynamic amplifier is part of the signal receiver.

In one or more embodiments, the node includes a dynamic amplifier operatively associated with the signal transmitter. In one embodiment, the dynamic amplifier is part of the signal transmitter.

In one or more embodiments, the node includes a dynamic signal dampener operatively associated with the signal receiver. In one embodiment, the dynamic signal dampener is part of the signal receiver.

In one or more embodiments, the node includes a dynamic signal dampener operatively associated with the signal transmitter. In one embodiment, the dynamic signal dampener is part of the signal transmitter.

Another aspect of the invention provides a sub-system including a plurality of nodes as described here above, wherein the plurality of nodes include pre-configured initial thresholds.

In one or more embodiments, the plurality of nodes include pre-configured initial transmitted signal characteristics.

In one or more embodiments, the threshold device and/or the signal control device are pre-configured such that one or more specific patterns of inputs signals trigger an output signal from the plurality of nodes.

In one or more embodiments, the threshold device and/or the signal control device are pre-configured to recognize a pattern of input signals and predict a pattern of stimuli next expected to be observed.

In one or more embodiments, the threshold device and/or the signal control device are pre-configured to seek an outcome state and to modify the threshold and output signals to ensure targeted input signals or patterns of targeted input signals match as closely as possible a defined or programmed target state.

In one or more embodiments, one or more of the plurality of sub-systems are pre-configured via starting connections and node thresholds to detect and action a specific pattern of inputs signals either from external sensors or detectors or in the form of a pattern of other activated nodes or sub-systems.

Yet another aspect of the invention provides a system including a plurality of sub-systems as described here above, wherein one or more of the sub-systems are configured to perform any one or more of:

store inputs signals present at the time or leading up to a pre-configured pattern being recognized and triggering a sub-system;

direct new nodal or modular connections such that additional patterns result in the same or different outputs;

reward, pursue, direct, or optimize specific types of outcomes for sub-systems or the holistic system in the form of more frequent detection of patterns of stimuli or inputs, patterns of firing or signals from connections of nodes and or sub-systems within the system (a level of abstraction), or optimized performance of the parts or all of the holistic system; and conduct a specific task.

In one or more embodiments, one or more of the sub-systems are configured to compare the performance of a sub-system or the device to other sub-systems or devices and prompt alterations, either random or based on previously stored alterations that have produced improved results, to the sub-system or devices connections, triggering input patterns, thresholds, or response patterns.

In one or more embodiments, various elements of the above-described system function similarly to neurons and the human brain. These elements include:
(1) a basic component device for emulating a neuron (node),
(2) node devices of varying complexity,
(3) sub-systems comprised of multiple interconnected individual component nodes, and
(4) a system comprised of a combination of interconnected nodes and sub-systems of varying complexity.

In one or more embodiments, the nodes and sub-systems or component elements are able to communicate with others dynamically or more accurately establish dynamic connections of varying degrees of complexity based on dynamic, non-fixed, or alterable connections methods.

In one or more embodiments, each element (node or sub-system) is able to communicate with one or more other elements using one or more dynamic methods allowing alteration to the characteristics of the connection and changes to direction or to which elements (nodes or sub-systems) a node is connected to.

To achieve this, nodes in one or more embodiments, are comprised of a method of transmission, a means of altering the direction of the transmitted signal, and a detector or receptor. One way in which a dynamic connection may be established is via the use of light. Other methods include the use of biological links established by incentivizing the growth of a medium between nodes (a slime mold could be used to create biological connections between nodes via which a signal may be sent); other forms of energy such as radio, microwave, magnetism, electrons via a biological substrate, etc. might also be used.

In the example where light is used, a basic node may be comprised of one or more light sources capable of generating one or more beams of light, a means of directing the beam or beams at the receptors of other nodes, and one or more receptors capable of detecting light transmitted by other nodes or other signal inputs such as external sensing devices or traditional transistors, circuits, or computers. More advanced nodes may also contain a threshold device. In still more advanced nodes, the node may also contain one or more other components for determining whether a light signal should be generated, a connection altered or new connection established, what characteristics those connections should have, and how the direction of a transmission or link should be configured.

The direction of the light transmission may be controlled by a component of the node devices. In one form, this may be achieved using mechanical methods. In another it may be achieved using fibers that contract based on the application of a current wherein the fibers are placed around the light emitting element and varying degrees of current and thus contraction applied resulting in the direction of the light being altered.

In its most basic form, information is generated and dispersed using beams of light where the pulse or beam of light does not carry information but rather represents the information itself in the form of an established connection.

In a more complex form, the node may also include a device which controls the intensity, frequency, and timing of the light emitted. In this more complex version the beam of light could carry information as well as represent information.

In the case where the light receptor is configured to utilize a thresholds below which it will not registered that light has been detected, the threshold may be self-adjusting to increase or decrease based on any parameter, frequency, etc. These intensity thresholds may be configured for any property of the method of connection. When light is used as the basis of a connection between nodes, these characteristics may include frequency and intensity. However, for other mediums such as sound or biological connections the properties of the medium are different and so the possible variables on which to apply a threshold may also change. The direction of control over the dynamic connection may also change.

In the basic light example, the thresholds may be reached in two ways, firstly by shooting a single, powerful beam that surpasses the threshold and secondly by receiving more than one weaker beam at a single receptor or sub-system in order to surpass the threshold. Each individual sub-system may have one or multiple receptors and light emitters, the goal of this is that any sub-system is able to fire a pulse or establish a connection and/or receive one from any direction and be able to send out multiple signals or establish multiple connections with other nodes.

The more angles or positions that a single node emitter or receiver may reach, the more possible connections may be made and so the number of outcomes generated by a cumulance of nodes increases logarithmically. Similarly, the more light emitters a sub-system has, the greater an effect that single node may have on a sub-system comprised of many nodes or a system comprised of many sub-systems and nodes.

Each light receptor on a single node may have its own threshold settings for frequency or intensity variables.

The light emitters may or may not have the ability to change the intensity of the light they fire. In the case that they do, this means that not only the direction of the connection or signal may change, but existing pathways may be reinforced and rewarded or they may be inhibited to optimize a target outcome.

Nodes may be created of varying degrees of complexity. In addition to being comprised of an emitter, a detector/receptor, a threshold, and a directional controller, nodes may also be comprised of traditional transistors, silicon circuits, or whole computers. These may be utilized to further determine if a signal should be generated when a threshold is exceeded, if alterations to the direction or other parameters of a signal or connection a node has, or to define a desired target state or preference for one or more nodes, connections, or patterns of inputs. (Nodes may be as simple as to consist of a receptor, a threshold, and emitter but may grow in complexity to incorporate binary transistors or even whole binary computers.)

Sub-systems may be created from multiple nodes. Each sub-system may be of varying complexity. Sub-systems may be either preconfigured to generate a signal in response to one or more specific patterns of input signals. Sub-systems may also include or be linked to other nodes or sub-systems that are initiated without any pre-configured pattern or threshold settings or are initiated with random or standard default settings.

A system may be comprised of any combination of multiple sub-systems and nodes. Very complex systems built from these nodes and sub-systems may appear to be fractal or scale invariant in nature, in that the holistic system is comprised of multiple unique sub-systems and nodes, each sub-system is in turn comprised of an entirely unique system of smaller and less complex sub-systems, which are in turn comprised of an entirely unique system of nodes of varying degrees of complexity.

Complex nodes and sub-systems may be able to function completely independently, storing unique information and performing its own unique functions. If a sub-system is complex enough, it may be preconfigured to show preferences to certain outcomes. This would be particularly advantageous in the development of artificial intelligence.

Just as between nodes within a sub-system, the methods of communication between the sub-systems may vary in complexity. They may send signals that contain data or some sort of message or information or the signal may simply represent the information itself. Sub-systems may be connected through more than one method. For example they may be simultaneously connected by a light connection and a physical connection formed by incentivized biological growth. The interplay between sub-systems may also increase in complexity; each signal may have some sort of a 'tag' on the end of it which shows the sub-system the signal came from. This would allow complex sub-systems to show a preference to certain other sub-systems, this could range from not accepting any signal with a tag to only accepting signals with a particular tag.

In any system comprised of multiple sub-systems wherein those sub-systems have been programmed or have adapted to have a 'purpose' or target outcome, the interaction of multiple such sub-systems may result in the dynamic formation of pathways to optimize performance of all given their interconnected nature. Any system of sufficient size or containing more than a modest number of such sub-systems and nodes will result in a constantly shifting and changing set of connections between those sub-systems as they seek to optimize their target state in a dynamic environment of many dynamic sub-systems. This may be used by the system as a whole to solve problems, learn, deal with external inputs and become more efficient through use.

In addition to receiving inputs and sending outputs to other nodes or sub-systems, complex nodes or sub-systems may be configured to receive inputs from one or more sensory devices or traditional transistors or computers as well as generate an output to other forms of devices such as motors, computers, circuit boards, or other controllable machines.

Combinations of nodes as a sub-system may be pre-configured via threshold levels and pre-established linkages such that one or more particular pattern of input signals produces a desired output.

An additional programmable sub-system of complex nodes may be configured to store other inputs present at the time or leading up to a pre-configured pattern being recognized and triggering a sub-system. Additional nodes or sub-systems may be configured or programmed to direct new nodal or modular connections such that additional patterns result in the same or different outputs.

Combinations of complex sub-systems may be pre-configured both to recognize and act on increasingly diverse and complex patterns but also to reward or optimize specific types of outcomes for sub-systems or the holistic system in the form of more frequent reception of patterns of stimuli or inputs, patterns of firing or signal via connections within the system (a level of abstraction), or optimized performance of the parts or all of the holistic system.

In the case of biological methods for connecting nodes, the mechanisms of receiving or forming a connection may be reversed. A food or other incentive would be excreted by a node in order to facilitate a connection from a host or target node as distinct from a node generating the directed connection.

Such a device may be relatively easy to make in its simple forms, as the machine grows in size and number of nodes, it's complexity in creation would increase. To create a single node that uses light as the computational medium requires only a small number of components: a component capable of receiving light signals, a component capable of sending outputs, a component capable of changing the direction of light output so that it hits the target node, a component capable of measuring and changing the thresholds, and a component capable of turning light inputs into binary computational processes and vice versa. All of these components are widely available and relatively easy to work with for a skilled person. Increasing the complexity of an individual sub-system may be achieved simply by increasing the computational capability of it. Each node, upon creation, would by definition have a starting point and so creating a group of these nodes in the form of a sub-system may be as simple as creating multiple individual nodes, placing them in firing range of each other and giving each the appropriate starting variables.

BRIEF DESCRIPTION OF THE DRAWINGS

The invention will now be described in further detail by reference to the accompanying drawings. It is to be understood that the particularity of the drawings does not supersede the generality of the preceding description of the invention.

FIG. 6 is a schematic diagram of an exemplary 8×8 grid of nodes;

FIG. 7 is a schematic diagram of an exemplary 8×8 grid of nodes illustrating a "smiley face" pattern that may be detected by a single node of a second layer connected to the grid of nodes;

FIG. 8 is a schematic diagram of an exemplary 8×8 array of nodes illustrating an "X" pattern that may be detected by a particular node configuration;

FIG. 11 is a schematic diagram of a 10×10 sample plane of data upon which a node system is able to perform device learning.

Referring now to FIG. 1, there is shown a basic version of a node 10 including a signal receiver 12 for detecting or receiving one or more input signals from one or more signal sources, a signal transmitter 14 for selectively connecting and transmitting the input signals to one or more other nodes; and a threshold device 16 to control the selective operation of the signal transmitter based on a threshold derived from one or more characteristics of the input signals. In some embodiments, nodes operate in a similar manner to an artificial neuron.

The signal receiver 12 may include one or more light receiving devices or sensors. Alternatively, signal receiver 12 may represent a port or connector through which a light receiving device or sensor may be connected. Example hardware incorporated into or connectable to signal receiver 12 include off the shelf optical sensor phototransistors or readily available but more advanced light detecting mechanisms as found in modern light meters or digital cameras. More generally, the signal receiver 12 may include or be connected to sensors that may detect light, a particular wavelength of light, or a range of wavelengths, sound, a particular frequency of sound, pressure, the presence of a chemical or molecule, electrical impulse, etc.

A basic configuration of logic gates (off the shelf transistors used as switches) is able to function as the threshold device 16. The threshold device 16 may also include one or more standard transistors, pressure valves, or electrochemical mechanisms having the characteristics of activation when an input level is reached or exceeded and/or deactivation if an input level is exceeded. Specifically, the threshold device 16 may be a device that fires, issues or passes on a signal output, or changes state and then resets when a signal input level is reached or exceeded and/or deactivated if a higher input level is exceeded but not as the result of inputs that do not reach or exceed the threshold or which exceeded a higher signal input level. Threshold devices may have both minimum and maximum levels such that only a signal within a range causes the component to activate and reset.

The signal transmitter 14 may include one or more light emitting devices. In one possible version of the most basic form this would be an off the shelf laser (a standard laser pointer pen). When the threshold is exceeded, the light emitter would be triggered. In other embodiments, the signal transmitter 14 may include other forms of energy signal creator and transmitter, such as an electrochemical output mechanism.

Although illustrated functionally, each node represents a hardware component that is able to be operationally mounted to a substrate 18 such as a circuit board, IC or chip formed of a semiconductor material such as silicon. A plurality of nodes is able to be operationally mounted to the substrate 18 to form a sub-system as described below. Additional supporting electronics such as capacitors, amplifiers and batteries may also be operationally mounted to the substrate 18. The substrate 18 may also include electrical interconnections (not shown) which may electrically connect the various nodes to supporting electronics and optionally connect the nodes to one another during operation for power and data transmission.

Figure 1:
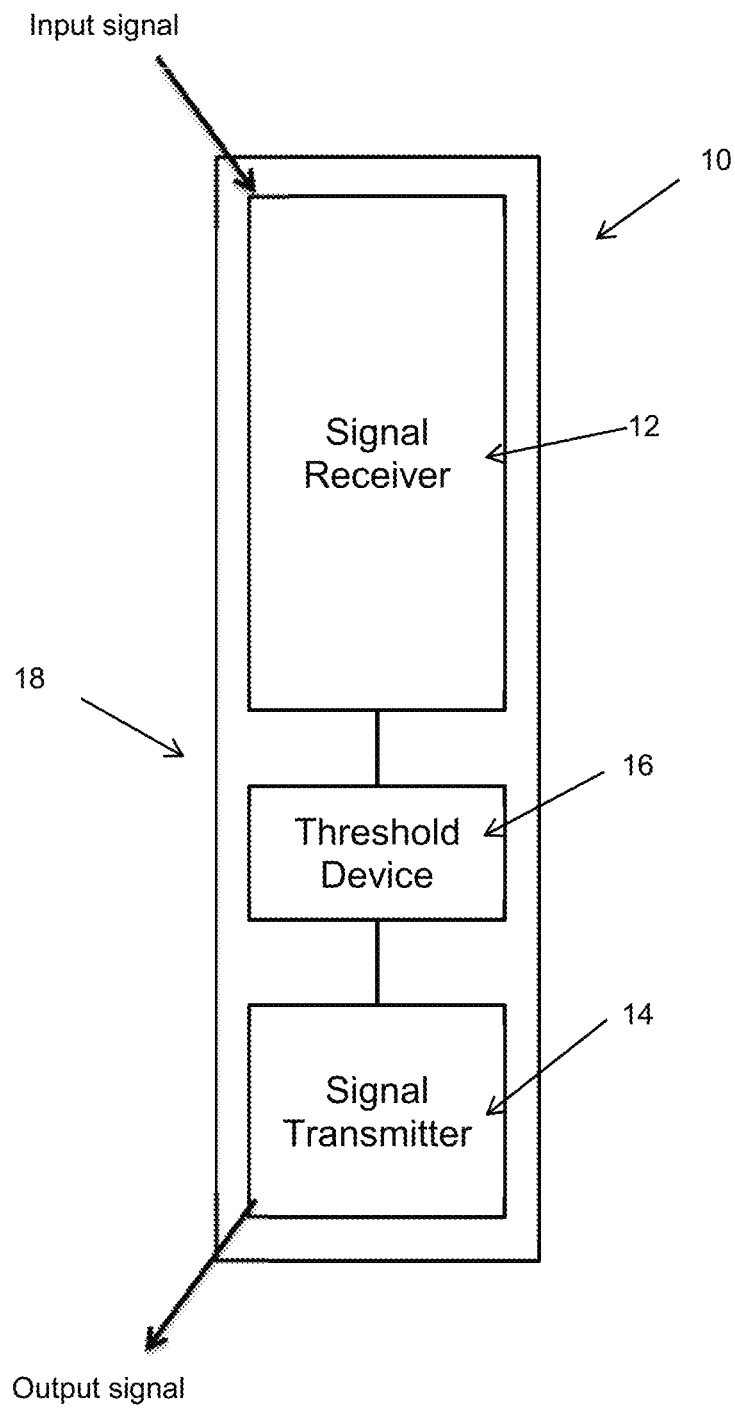
FIG. 1 is a schematic diagram of one embodiment of a basic node.
Figure 2:
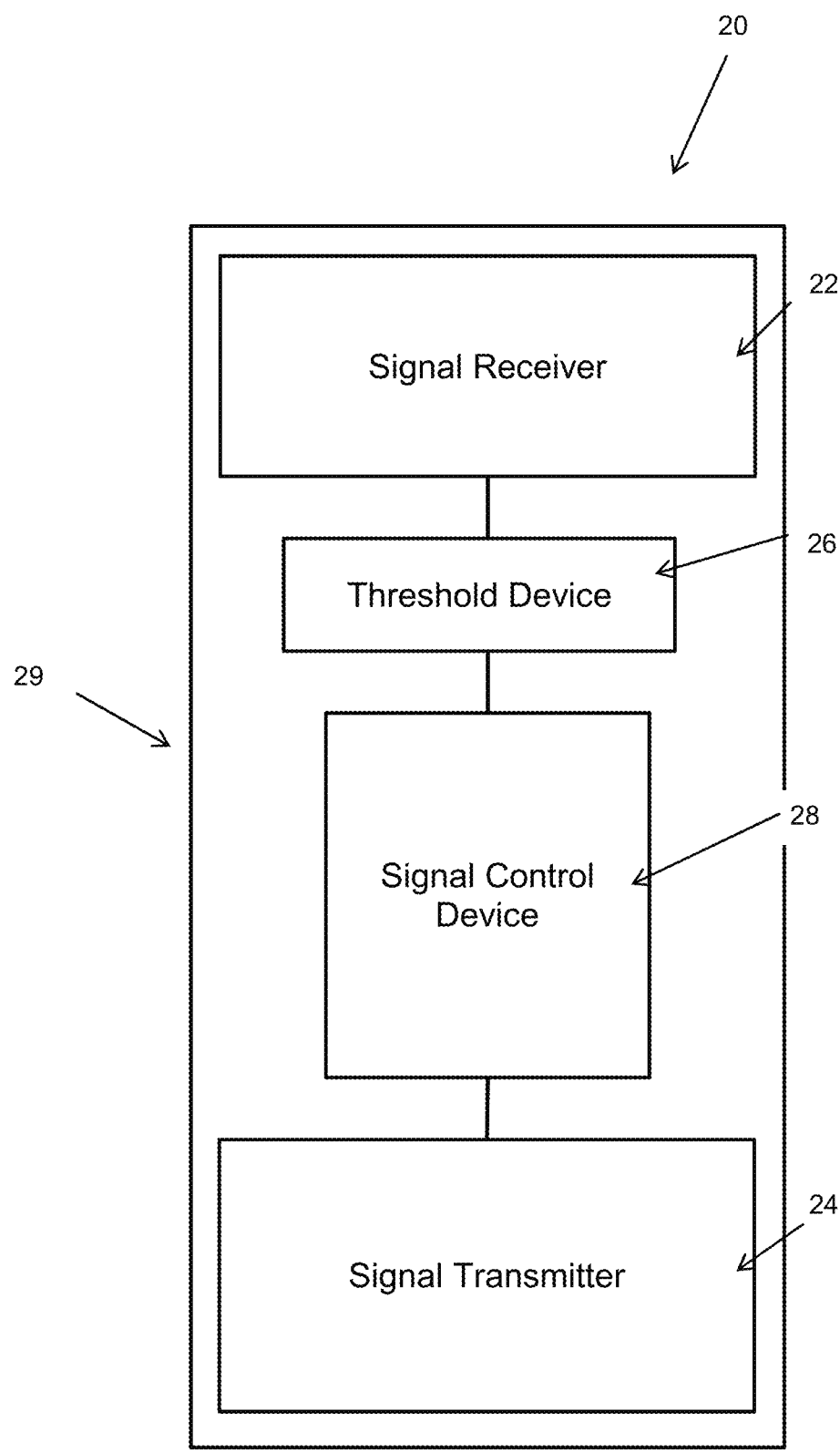
FIG. 2 is a schematic diagram of one embodiment of a more complex node.

FIG. 2 depicts a more complex node 20 including a signal receiver 22, a signal transmitter 24, and a threshold device 26. In addition, the node 20 further includes a signal control device 28 for dynamically altering one or more characteristics of the transmitted signal. The signal control device 28 is adapted to dynamically alter any one or more of the direction, intensity, amplitude, period, frequency, and waveform of the transmitted signals. The signal control device may include one or more transistors, circuits, computers or other programmable configurable components.

As with node 10, node 20 may be mounted to a substrate 29 during operation for communication with other nodes.

Figure 3:
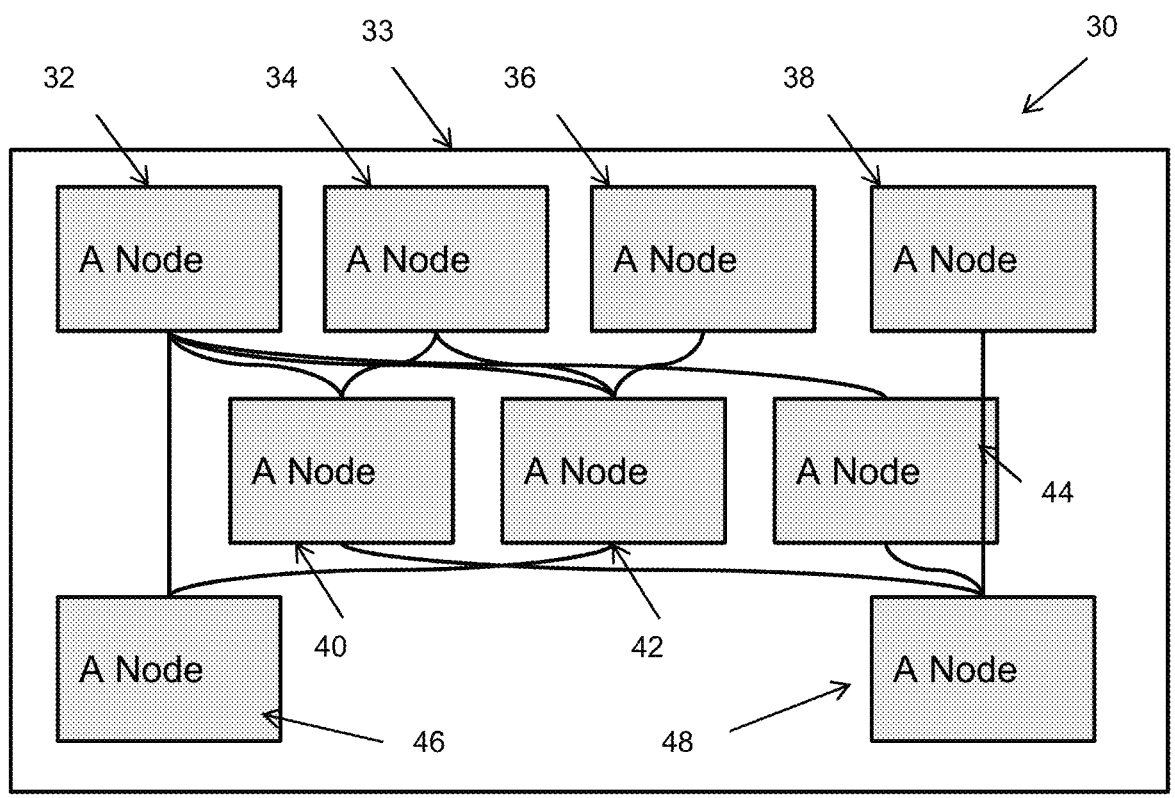
FIG. 3 is a schematic diagram of one embodiment of a sub-system including a plurality of nodes.

As may be seen in FIG. 3, a sub-system 30 comprised of multiple such nodes 32 to 48 may then be constructed. In operation, sub-system 30 is preferably formed on a substrate 33 such as a circuit board, IC or chip. By configuring the starting point thresholds (e.g. the number and configuration of transistors) each node and/or each specific pathways of light transmission between nodes by daisy chaining many nodes in parallel and in sequence, the device could readily be structured to "react" to a specific pattern of light or visual stimuli. As a device it would send a final signal but only where the specific pattern of initiating stimuli was present. Note that the connecting lines illustrated in FIG. 3 are indicative only to show nodes connected to multiple other nodes.

Figure 4:
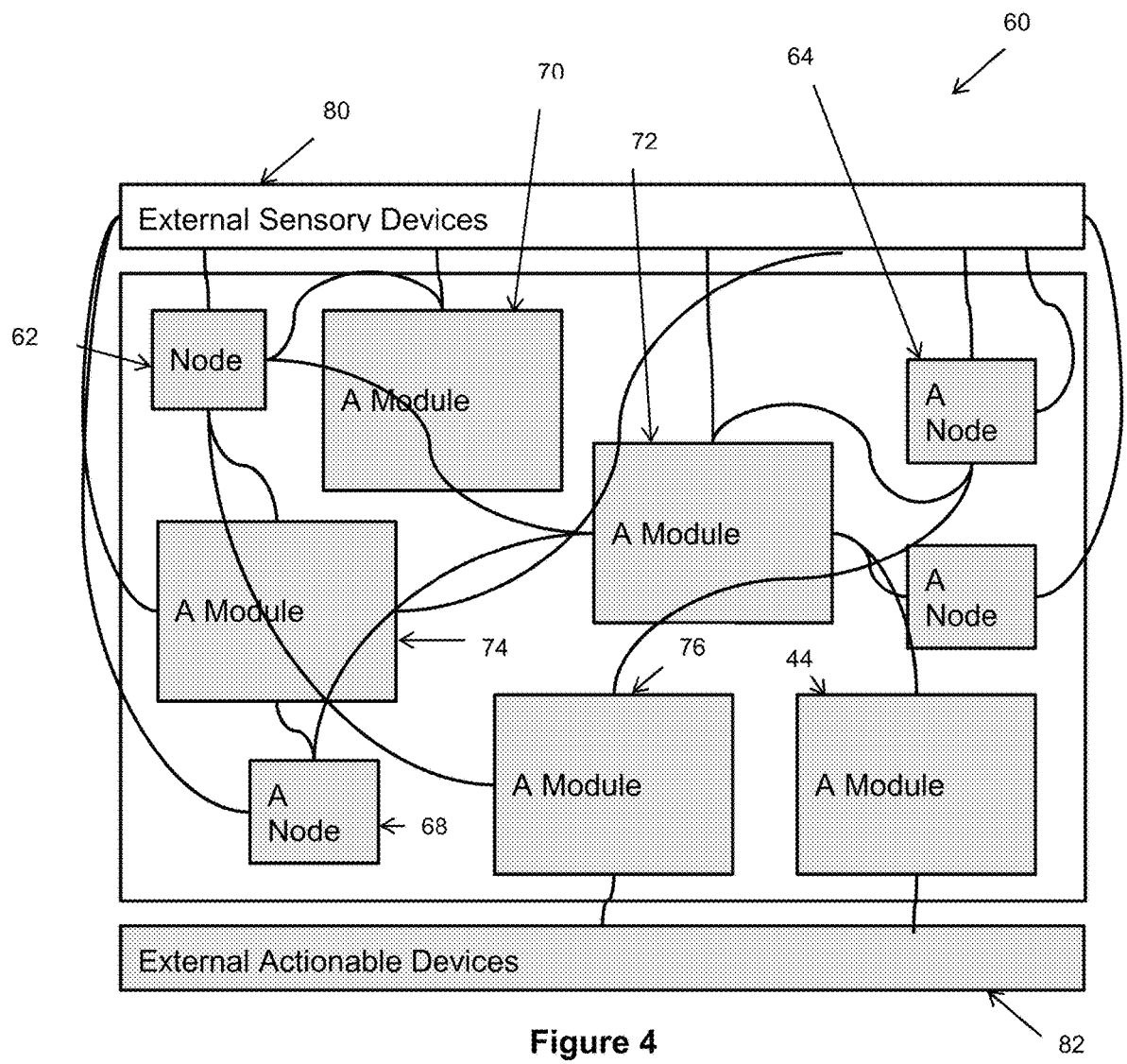
FIG. 4 is a schematic diagram of one embodiment of a system including a plurality of sub-systems.

A system 60 including a plurality of nodes 62 to 68, a plurality of sub-systems 70 to 78, external sensory devices 80 and external actionable devices 82 is depicted in FIG. 4. An example external sensory device is a video-input and an example external actionable device is a motor control respectively. The system 60 includes pattern recognition sub-systems to recognize complex multifaceted patterns and/or associated complex reactions as well as the relative comparison of expected sequences of patterns. An initial configuration of nodes that "recognizes" a pattern and reacts based on its initial threshold configuration paired with additional sub-systems that store similar but slightly different patterns that are expected next could be configured. A third sub-system could be configured that stores a pattern of patterns. This third sub-system would be configured to react where in the first pattern is expected to be followed by a second pattern but instead some other set of stimuli is received. Where this second pattern is not triggered, this third much simpler sub-system of nodes would be configured to detect its non-occurrence and send a signal to one or more nodes in the collective to change the position (or selection) of their transmitter, thus creating a dynamic and changing system that increases performance toward the desired pattern of patterns.

This fully dynamic device could be created by the addition of a control motor for a directional joint to which the core light emitter would be attached or the addition of more than one light emitter, and either a modification to the logic gates (e.g. transistors) such that if a second threshold is received, it either represents instruction to move the emitter or select a different emitter or the additional of further light sensor(s) and one or more additional logic gates/transistors to manage control of the light emitters. In one or more embodiments, a motor and control device may be used to change the direction of the light output. This could be accomplished with a single motorized hinge or a micro electromechanical mirror device if the receiver nodes are placed in predetermined and fixed locations. In the most basic execution of the invention, these would be instructed to move to one of two possible positions. In the preferred execution, however, three motorized hinges capable of 360 degree motion in one axis plane fixed at right angles to each other would achieve full 360 degree spherical coverage.

A modification of the existing threshold transistors is the addition of a light receiving device or devices and associated transistors that are allocated to control the direction of the light emission component via a motorized hinge or the selection of which light emitting component is triggered if more than one threshold is detected. In the most basic configuration of nodes, the light emitter could be set to transmit in only two specific directions. A simple set of logic gates (again off the shelf transistors) would be used to control the direction of the light emitting component to one of these two pre-set target positions. In this most basic system, the 'control' receivers would respond to receipt of two single pulses. In the case where dedicated control receivers are used this could be achieved via a single signal. In the case where the receiver sensors are also used for control purposes, the associated transistors would be configured with two thresholds. One threshold for determining if a detected light signal is to instruct a change in direction for the light emitter, the other threshold for standard interpretation as to whether the node should send on a signal. In the simple case of two light sensors, any of the four combinations of two pulses (AA, AB, BA, BB) could be used to instruct where to point the light emitting device or instruct for a change in direction/position of the light emitter. (The output of this circuit will tell the motors of the device to move to one preconfigured directions so that its light emitting device points in the direction of another node.)

This simple version of the device is able to be constructed simply by providing a laser, three motorized hinges and a small number of logic gates to create a single node. To produce a single simple sub-system, only a cumulance of these nodes, placed in the correct positions is required to produce a result.

By the addition of only a further small number of logic gates to each circuit it is possible to configure the laser to direct its output light beam at more than two specific nodes. This addition may make the machine that is a cumulance of nodes inherently variable and dynamic based on: 1) the variable nature of the external inputs the nodes receive; 2) the ability of nodes to receive input both externally and internally; and 3) the output nodes that are able to send a message externally. The signal that these output nodes send may be in the form of a control signal for moving a motor that turns a wheel, or the powering of a light and people are able to see. With the ability to change the connections of the individual nodes, the machine may increase in complexity much faster than a binary computer increases in complexity. The total possible number of paths a single message may take in a binary computer is defined by 2n where n is the total transistors. This machine would have xn where n is the total number of nodes in the system and x is the number of possible other nodes to which a single node may send a signal. As long as varying external inputs are being introduced to the machine, the machine itself will vary. It is inherently variable firstly because the physical structure of it allows the ability for variability and, secondly, because the inputs it receives from the natural world are constantly and randomly variable. A machine that functions based on this may also increase in complexity as far as the creator wants to go, much like any other form of computation. A very complex machine constructed out of nodes is simply a larger number of nodes, or of more complex nodes, or both.

To emphasize the above described functionality, a number of example implementations will now be described.

The Simplest Form: A Node Type A

The simplest embodiment of a node consists of three component parts: an input signal receiver device; a threshold device; and a signal output device (or signal transmitter), as described above. The signal receiver detects or receives one or more input signals from one or more signal sources. The signal output device selectively connects and transmits the input signals (or a modified version thereof) to one or more other nodes. The threshold device controls the selective operation of the signal output device based on a threshold derived from one or more characteristics of the input signals.

A simple type "A" node has a single threshold and is capable of recognizing the simplest form of a pattern; "on" or "off" (or, equivalently "1" or "0"). A node built from a light sensor, for example, could be used to detect if a light was on or off.

A Complex Pattern Detection Device Built from Nodes

A machine built from multiple nodes is capable of recognizing exceedingly complex patterns from simple patterns such as individual Morse code signals or characters to recognizing an image containing a face or even multi-format sensory input recognition (e.g. image, voice/sound) of a specific person for secure access to a facility.

A simple example of this may be seen in the combination of two type A nodes using light sensors. The first has a threshold device that triggers on a very low input level. The second has a threshold device that requires a comparable signal input but where the threshold is only triggered if the signal input is sustained for a length of time fractionally greater to the reset cycle time of the first node. Such a two-node configuration could be used to recognize the patterns of a dot and dash of Morse code being sent using a light emitting device. Any brief pulse of light would trigger the first node only, signaling a "dot" output. Any longer pulse of light would trigger both nodes, thereby signaling a "dash" output.

By combining hundreds or thousands of type A nodes, a node array could recognize very complex patterns such as the presence of a face in an image. The activation of specific nodes but not others would occur from the projection of any facial image onto the array.

Figure 5:
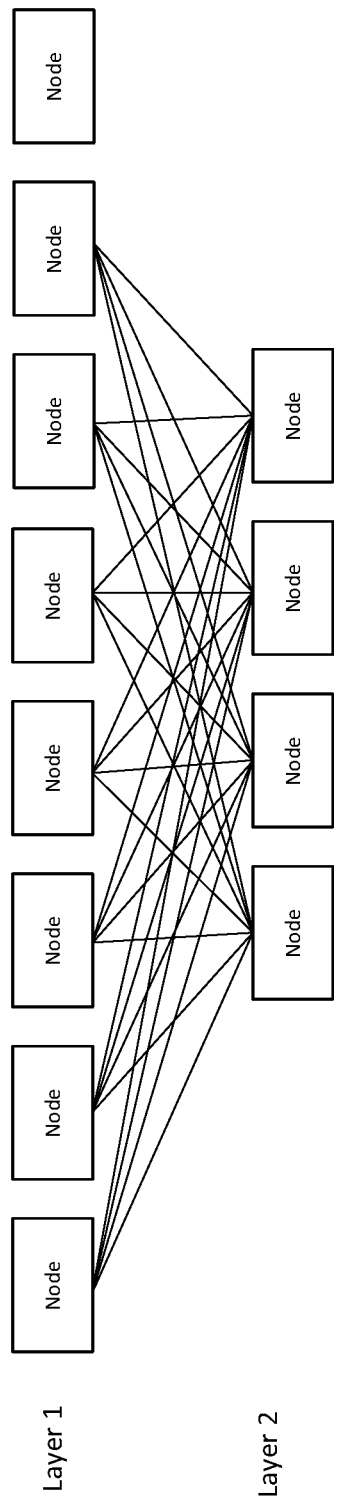
FIG. 5 is a schematic diagram of a two layered system of nodes.

A more complex scenario may be achieved by combining an initial layer of nodes on which the image is projected and a second layer of fewer nodes that each receive signals from the combination of multiple nodes in the first layer as illustrated in FIG. 5. In this scenario, the nodes in the second layer have thresholds configured to only be met if signals are received from multiple nodes from the first layer, a pattern of first layer activation may be recognized.

For example, consider the grid of nodes illustrated in FIG. 6. A simple second layer comprised of a single node configured to receive an input signal from the nodes located at: (2,3), (2,6), (6,2), (6,7), (7,3), (7,4), (7,5), and (7,6) may be used to detect the "smiley face" image pattern illustrated in FIG. 7. Thus, having a threshold configured to only fire when the combined signals from eight first layer nodes are received may recognize the above simple smiley face pattern.

Additional comparable configured second layer nodes connected to receive inputs respectively from first layer nodes: (2,2), (2,5), (6,1), (6,6), (7,2), (7,3), (7,4), and (7,5) and (2,4), (2,7), (6,3), (6,8), (7,4), (7,5), (7,6), and (7,7) would be triggered by the same simple smiley face pattern appearing just to the left or right respectively.

Six additional comparably configured second layer nodes could be added to recognize and fire when this pattern is "seen" for the remaining possible first layer node combinations corresponding to the target pattern.

Recognizing more complex patterns such as actual human faces may be achieved in the same way simply by expanding the number of and variety of first layer and second layer nodes or the addition of a third or fourth layer of nodes.

More Complex Node Type B

A more complex node (designated node type "B") may be created by implementing a node having multiple sensors as inputs and/or multiple outputs. As such, each node represents a higher order data unit able to process more than a single bit of information.

More Complex Node Type C

A more complex node than type A or B may be constructed which includes the addition of a modifier on the threshold device such that the threshold level may be adjusted up or down dynamically. These are designated type "C" nodes. Type C nodes may further include either or both of an input amplifier or dampener (or plurality thereof) for modifying the input signal received from a sensory input device or node before being passed to the threshold device. In some embodiments, the input amplifiers or dampeners are part of or associated with the signal receiver device.

Type C nodes may also include either or both of an output amplifier or dampener (or a plurality thereof) to modify the transmitted or output signal from a node. In some embodiments, the output amplifiers or dampeners are part of or associated with the signal output device. In other embodiments, the output amplifiers or dampeners are part of or associated with the threshold device.

Amongst other benefits, these more complex variations of the common node enable the more efficient recognition of complex patterns using fewer nodes. In the case of the smiley face pattern recognition, a single layer of nodes could replace the two layers described above for recognizing the simple smiley face pattern. Each second level node would simply be constructed to have a sensor in each of the positions described for the first level nodes eliminating the need for the first layer of sensory nodes. These variations would also enable a second layer of nodes to detect more complex variations of a pattern or multiple different patterns. Amplifiers and dampeners would allow partial or weaker signal inputs received from various combinations of first level nodes to still trigger the second level node. Or where a third layer of nodes are involved and a third layer nodes are connected to both second layer and first layer nodes the combination could readily identify a partial pattern accurately. By way of example, higher level nodes could be used detect different colors or greyscale values in image pixels.

By way of example, a type C node with an amplifier to amplify an input signal received from any node in column 8 of the grid of FIG. 6 would allow the nearly complete face pattern to be recognized and trigger a corresponding output signal. This could occur even when the received signal was less than the required threshold and received from seven sensory nodes.

Complex Node Type D

A more complex node type "D" may be constructed from any of node types A, B or C with the addition of an adjustable amplifier, dampener or threshold and a corresponding threshold manipulator device. The threshold manipulator device may comprise a fixed predetermined device or may be dynamically controlled external from the node (e.g. by a control signal). In fixed predetermined threshold manipulation device, the threshold may increase or decrease at a steady rate over time unless triggered or the threshold may increase or decrease every time the threshold is triggered.

Amongst other benefits, a type D node allows a single physical assembly of nodes to be modified from recognizing one pattern to recognizing a different pattern or multiple other patterns without altering the physical connections or placement of the nodes themselves.

Type D nodes also allow the device to be configured to become more or less sensitive to one or more recognized patterns over time, through use, or through the absence of use (e.g. the absence of being triggered). In one or more embodiments, the threshold is able to be dynamically derived and changed based on one or more characteristics of the input signals of multiple input signals.

Complex Node Type E

A more complex node type "E" may be constructed from any of node types A to D constructed with two forms of input sensors within the signal receiver and/or output transmission formats. A first type of input sensor (the "primary") comprises one or more sensor device inputs configured to receive a particular type of signal input (e.g. light or sound). A second type of sensor input (the "secondary") is configured to receive a signal type that is distinct that of the primary input sensor (e.g. light, sound).

In an alternate embodiment of type E node, rather than a secondary form of sensor, the threshold device is capable of dynamically adjusting the threshold based on the one or more characteristics of the input signals.

A type E node would allow for more complex patterns to be recognized with fewer nodes.

Where the secondary form of input or output is connected to an amplifier, dampener, or threshold manipulator of another node of type C, D, or E, it would also enable dynamic changes to the machine built from nodes and its effectiveness in detecting complex patterns by providing an additional form of detection based triggering that rather than being adjusted via time or an individual nodes firing or not firing may have its threshold adjusted by the firing of nodes not part of the actual initial pattern detection configuration.

One or More Second Pattern Detection Layers

A machine comprised of multiple second level (pattern detection) node layers is able to be constructed. This machine would allow one layer of sensor nodes to be used to detect multiple independent patterns.

A second level node connected to nodes (2,3), (2,6), (6,2), (6,7), (7,3), (7,4), (7,5), and (7,6) of the grid illustrated in FIG. 6 would detect the smiley face pattern illustrated in FIG. 7. An additional set of second layer nodes connected to nodes (2,2), (3,3), (4,4), (5,5), (6,6), (7,7), (4,5), (3,6), (2,7), (5,4), (6,3), and (7,2) would detect the "X" pattern illustrated in FIG. 8. Similar second level nodes connected to first level nodes shifted to the left and right or up and down by one row will recognize any X pattern.

Fixed Target Pattern Storage, Comparison, and Elimination of False Positives

While the hard-wired nature of a basic machine comprised of a set of sensor nodes and one or more second level nodes is fixed in the number of pattern or patterns it is configured to recognize, a machine built entirely of nodes may also be constructed to recognize a wide diversity of complex patterns and be constructed in such a way that it does not mistakenly trigger as a result of a pattern of stimuli nodes being triggered by a pattern involving all of its target sensory nodes as well as others (e.g. a false positive).

Consider a machine built entirely from standard type A nodes differentiated only by the threshold settings of the nodes. The configuration illustrated in FIG. 9 would allow for a stored pattern of stimuli to be identified. For the purpose of explaining the function within the machine of different clusters of nodes, the nodes are labelled as input sensor nodes, sequencing nodes, target storage nodes, comparison nodes, determination nodes, event occurrence nodes, and a final true/false node. In a simple example of nodes used to identify a set of observed stimuli match the stored pattern, a total of 32 nodes might be used.

In this example:
Four input sensor nodes: I(1,1), I(1,2), I(2,1), and I(2,2) are connected to their corresponding Sequencing nodes I(1,1) to S(1,1), I(1,2) to S(1,2) and so on. All input nodes are also connected to the EO1 event occurrence node. Input nodes have a threshold of zero and an output signal of one.

Three or more event occurrence nodes EO1, EO2, EO3, are used. All EO nodes have a threshold of 1 and an output signal strength fixed at 1 irrespective of how many input signals are received. As a result, EO1 is triggered by any input detected by one or all four I nodes.

The first event occurrence node EO1 is linked to from I(1,1), I(1,2), I(2,1) and I(2,2).

EO1 output is connected to EO2 and the Target Pattern Storage nodes T(1,1), T(1,2), T(2,1) and T(2,2).

EO2 is connected to EO3 and the Comparison Zero CZ(1,1), CZ(1,2), CZ(2,1) and CZ(2,2) discussed below.

EO3 is connected to each of the Determination Nodes D(1,1), D(1,2), D(2,1), and D(2,2).

Four Target Pattern Storage nodes representing a stored pattern. A pattern may be stored by configuring the threshold of Target Pattern nodes for which stimulation is part of the pattern to zero and nodes the activation of which is not part of the pattern to a threshold of anything greater than the output signal strength of the EO1 node.

In this example, if nodes T(1,1) and T(2,2) are configured to have a threshold of zero such that they generate an output signal in the event of any input signal from EO1 (and by extension are triggered by any I node stimulation) and T(1,2) and T(2,1) are configured with a threshold of 2 or greater. The overall machine will generate a D node activation indicating the stored target pattern was detected or matching stimuli were detected when I(1,1) and I(2,2) are stimulated and I(1,2) and I(2,1) are not. All four T nodes receive an input signal from the EO1 node. In this way, on any activation of any of the I nodes EO1 fires and in turn fires activating the appropriate configured T nodes. In this case, the target pattern is a diagonal sequence (1,1) and (2,2). On any activation of I, EO1 will fire and T nodes with a threshold of zero will fire the intended target pattern. T nodes are connected to their corresponding Comparison Two(C2) nodes e.g. T(1,1) to C2(1,1), T(1,2) to C2(1,2) and so on.

Four Sequencing Nodes S(1,1), S(1,2), S(2,1), and S(2,2) are used. Sequencing Nodes have a threshold of 1 and an output signal of 1. They simply pass on the signals received from activated Input nodes.

Four Comparison One (C1) nodes where each Sequencing node is connected to its corresponding C1 node. S(1,1) is connected to C1(1,1), S(1,2) is connected to C1 (1,2) and so on. Each Target Node is connected to its corresponding C1 node, T(1,1) is connected to C1(1,1), T(1,2) is connected to C1(1,2), and so on.

C1 nodes have a threshold equal or greater than 1 and an output of 1.

Four secondary comparisons nodes C2 are used. Each is configured to fire on a signal equal or greater than 2 (=>2). C2 nodes are connected to by their corresponding input nodes and corresponding target nodes. I(1,1) and T(1,1) are both connected to C2(1,1), and so on.

C2 nodes have an output of 1.

C2 nodes are connected to their corresponding Determination D nodes. C2(1,1) to D(1,1) and so on.

Four Comparisons Zero nodes CZ are used. Each is configured to fire on a signal greater than zero (>0).

CZ nodes receive signals from EO2 and their corresponding C1 nodes.

CZ nodes have a threshold to fire on greater than zero but NOT fire on a signal of 2 or greater. They have an output of 1.

Four Determination nodes (D) are used. They receive input signals from corresponding CZ and C2 nodes as well as EO3. D nodes have a threshold of equal or greater than 2.

One Pattern Match node is used to determine a true or false outcome. The pattern match node is connected to from all D nodes, has a threshold of 4 and an output of 1. If it receives a signal from all four D nodes then it has confirmed that the input pattern detected by the I nodes is an exact match to the pattern stored via the configuration of T nodes threshold levels.

It follows that if a simple comparison like this may be made, with increasingly complex systems, increasingly complex, specific and varied comparisons may be made. Once any difference may be identified, the same principle in any very complex system would allow for very complex comparisons and identifications such as the identification of faces or the classification of photos or even more complex and multifaceted forms of identification. Once stimuli patterns of multiple forms are identified and a comparison of input conditions made via the combination of various node sets, more complex and abstract patterns may be singled out and identified.

Multiple Pattern Recognition Machine

A machine capable of recognizing and triggering an action based on the recognition of multiple patterns either discretely or in combination may be built simply by combining multiple sets of nodes or machines of nodes representing fixed recognized patterns such as described in section the Fixed Target Pattern Storage, Comparison, and Elimination of False Positives section above. Such a machine could be used to recognize exceedingly complex patterns comprised of many sub pattern elements. For example recognizing an object based on visual sensor nodes of multiple wavelengths, multiple sensor nodes detecting the presence of different molecular compounds, and multiple sensor nodes detecting light reflection and thus shape from two or more focal points.

A simple machine could be constructed as described above in the Fixed Target Pattern Storage, Comparison, and Elimination of False Positives section that recognizes multiple discrete target patterns by utilizing the same construction except for the addition of multiple target node sets, one for each intended recognizable pattern, and multiple Determination nodes, again one for each recognizable pattern.

In the case of multiple target patterns, EO1 would need to be connected to each of the discrete sets of target nodes representing the various discrete patterns the machine is intended to recognize. Each of those target node sets T2, T3, etc. would need to be connected to C1 nodes and a discrete set of C2 nodes corresponding to the set of T nodes (e.g. T2 would be connected to C2-2, T3 would be connected to C2-3, and so on). Each C2 node set would be connected to its own corresponding D set. CZ nodes would be similarly connected. Alternately multiple simple target identification machines could be used to detect a complex pattern comprised of many component sub patterns.

Complex Node Type F

A complex node type "F" may be constructed having directable outputs (signal transmitters), directable input sensors, or both and a direction control circuit or control device.

In one or more embodiments, the signal receiver is adapted to alter the direction from which input signals are received.

Figure 10:
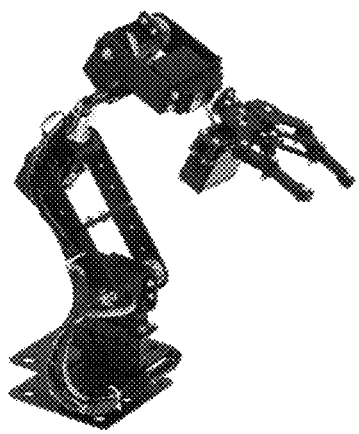
FIG. 10 is a diagram of a mechanical device having a series of mechanical joints and which may be controlled by a sub-system of nodes.

In a further complex version of a node, in addition to one or more input sensors, a threshold, an output signal transmitter, and with or without one or more amplifiers, dampeners, or variable threshold device, the node is constructed to include a control device, such as an integrated circuit, and mechanisms that enables either or both the input sensors and output transmitters to be spatially directed. This may be achieved in a variety of ways. A series of mechanical joints and a motorized mechanism is one example, as illustrated in FIG. 10.

In another preferred embodiment, direction is achieved via the stimulation of helical fiber structures that contract when stimulated by electrical current enabling 360 degree control over direction and three-dimensional control of the angle of the end point direction through variable levels of stimulation of parallel and opposing fibers or strips. In yet a further embodiment, biological agents or a combination of biological agents and residues are used for both signal transmission and as the basis for directing the signal. Slime molds, for example, will reliably grow toward food sources in proportion to the magnitude of the food source. As such a device that controls the release of variable quantities of a suitable food would enable both directional control of slime mold tendrils and the thickness of those tendrils and associated residue left by them. Subsequent utilization of the secretions or slime mold tendrils as a substrate for the placement of conductive material would allow such connections to be utilized for signal transfer.

Directability for the output or outputs of a node substantially increases the number of other nodes or devices to which a single node may communicate or send an output signal. This flexibility produces an exponential increase in the complexity of patterns that may be identified or stored as well as the possible "actions" that may be initiated as a result. One signal output is no longer limited to communicating with a single other node or device of nodes. Nodes with multiple output signal devices are not limited to that number of other nodes.

Just like making thresholds variable allows a system of nodes to store patterns in a dynamic or changeable way, a system with nodes containing dynamic directable signal transmitters is able to store information in a new way. Information or patterns in a system with dynamic directable inputs and outputs are stored in the positions of the signal inputs and outputs as well as in the specific interconnected structure of specific nodes with specific threshold values and associated amplifier or dampener impacts.

The addition of dynamic directable signal transmitters and sensors to any form of node, simple or complex, enables an increasingly efficient form of complex pattern identification, target pattern storage, and complex sensory input analysis or comparison as well as the ability for the patterns the system recognizes to be changed or to dynamically adapt without external influence. In the first instance, external controls directing instructions to the control circuits of the method for directing inputs and outputs would allow for dynamic reconfiguration of what nodes are connected to what other nodes and thus the pattern or patterns recognized, stored, or compared as well as the method of comparison and signal output generated by various possibilities of recognizing full or partial patterns or variations. In the latter case, the system could be configured such that outputs of various nodes are directed at the secondary inputs of other nodes or the directional control devices of one or more nodes. A collection of partial patterns recognized could be configured to direct a signal to randomly or specifically modify other nodal connections.

Such dynamic connections between nodes would greatly simplify the use of multiple node sets used to store target patterns (as described above) by a single sensory node set.

Figure 9:
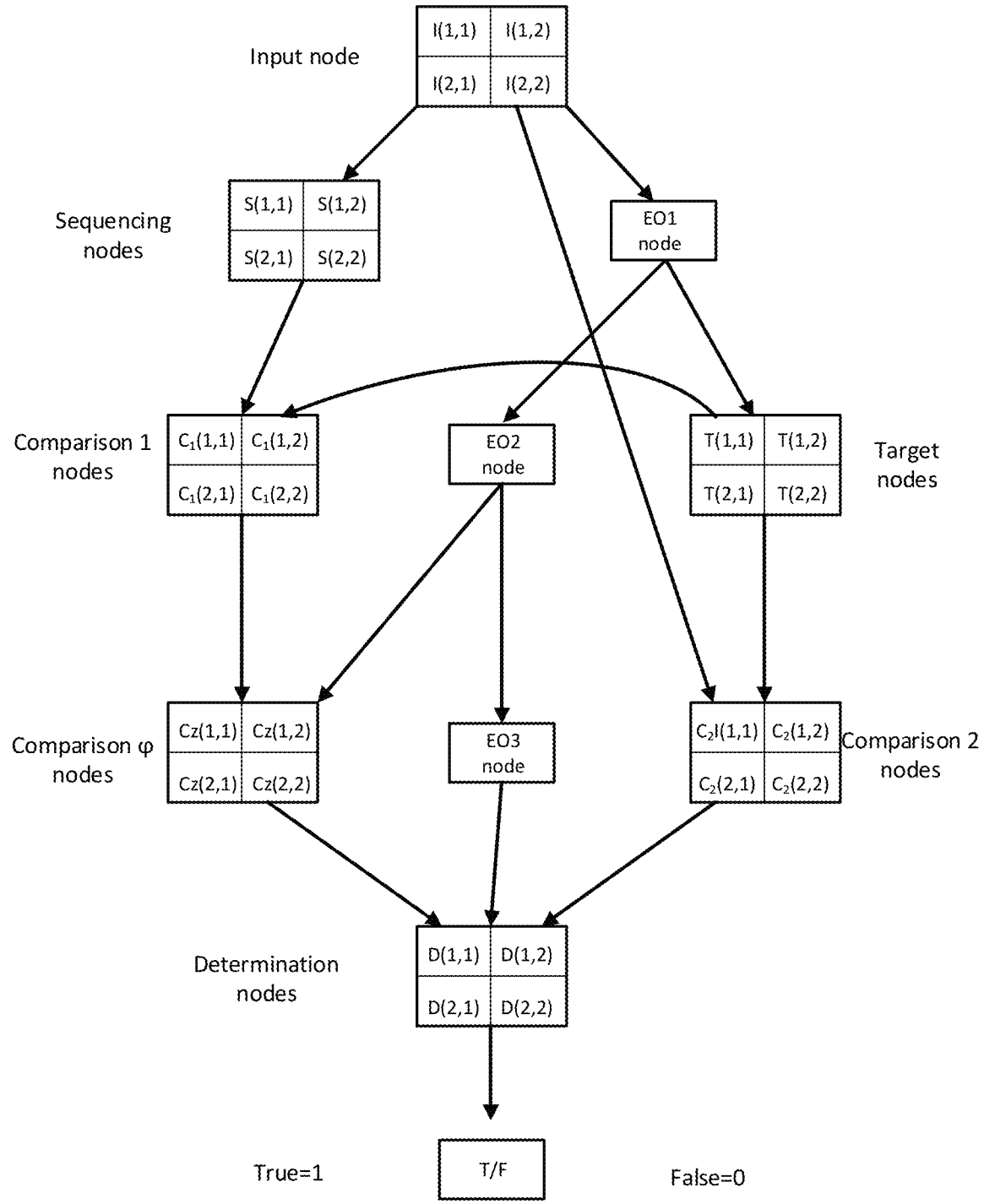
FIG. 9 is a schematic illustration of a configuration of nodes adapted to perform fixed target pattern storage and comparison.

Imprintable Pattern Storage/Fixed Storage of an Extended Pattern Based on First Triggering of a Target Pattern By incorporating one or more sets of sensory nodes and one or more target pattern node sets into a comparison or target confirmation node configuration as illustrated in FIG. 9, additional functionality may be achieved. In particular, a set of nodes may be configured such that they store or copy more or all of an extended pattern of stimuli that occurred or was activated in the one or more sensory node sets at the time the target pattern node set was recognized/triggered.

An Extended Target Pattern Storage (ETPS) Node set, which uses node types C, D and E, has modifiable threshold control devices configured to adjust their thresholds. On first firing of T nodes of the initial target node set, the signal output of I are transmitted to the secondary input of the ETPS node set and the thresholds of the ETPS nodes set to match the 0 or 1 of the I-nodes they are connected from. The T node output is also connected to nodes connecting the extended target array to an extended array such that Z requires the larger pattern to be triggered subsequently. T is preconfigured to be connected from the larger array.

Meta Pattern Target Storage

In a machine with multiple sensory nodes, multiple pattern detection target node sets, and third level True/False or determination nodes representing target pattern recognition, a complex pattern comprised of a collection of multiple first level patterns may be identified.

Target nodes sets may also be configured representing these complex pattern of patterns at higher levels, a target pattern recognition machine connected to from multiple other pattern recognition machines.

As is clear from the above, a machine comprised only of simple type A nodes is capable of incredibly complex pattern recognition additional ode types increase the complexity of patterns and purposes these machines may be used for. The final output signal or signals from one or more pattern recognition machines in isolation or in combination may be used to trigger action such as the initiation of a motor for directional motion, the movement of control surfaces, alarms, etc. Using only very simple machines a submersible vehicle could be constructed with node machines using sensors for light, pressure, sound, gravitational, electroconductivity, magnetism, energy levels (in a storage device such as a battery) and the presence of chemical compounds. Target patterns for each machine could be preset to correspond to various water depths (light and pressure), battery energy storage levels, and the presence of oil (on the surface) or gold or lead on the seafloor. With one or more machines producing output signals in response to target recognition corresponding to the presence of specific external conditions that then are used to activate specific subsystems and corresponding desired motion or action (the transmission of a signal containing a location to another vessel).

Dynamic Memory

Dynamic connections between nodes enable dynamic pattern storage or dynamic storage of node machine configurations that are more effective rather than less effective at detecting specific stored target patterns.

Nodes used in dynamic memory are essentially those not used in the direct input or output in a system of nodes. There is information represented in all parts of all nodes relevant to the processing or identification of patterns. This potentially includes but is not limited to the position of the output signal transmitter, the value of the threshold and the values of the amplifiers/dampeners on the inputs/outputs.

When one or many of these nodes are used and their variable characteristics or components are adjusted they may be used for active/dynamic storage.

One way of implementing dynamic memory is creating a sub-system responsible solely for the storage of relevant information is imitation memory or storage via nodal mimicry. In storage via nodal mimicry, systems of nodes are configured with the sole purpose of copying the behavior or activation settings of specific other node sets. These imitator nodes are configured to copy input nodes so that this information may be referred to by the machine at a later time. In such a situation, a circuit in the input node, or any node being imitated, would register the key pieces of information in that node (e.g. activation, threshold, input and output direction settings). These key pieces of information are those relevant to the processing and identification of patterns or any subset of them. Collections of nodes having secondary inputs are connected to by the nodes triggering them and are configured so as they adopt the threshold, amplifier, and dampener settings of the target input nodes they are to mimic.

Internal Synchronization Signal or Synchronization Clock for Triggering Sequential Node usage (Rather than Event Based Triggering via EO Nodes) or a Hybrid of both For some machines, it may be more advantageous to use an alternative to event based triggering EO nodes. An example of an alternative is giving each node an internal clock or to link all nodes via a synchronizing signal output ensuring nodes fire in a consistent timing.

Device "Learning"

Device learning may be implemented through self-directed adaptation to achieve meta target pattern identification. This may include a sub-system comprised of a system node set with a dynamically stored target pattern that self-adjusts to minimize energy consumption without degrading meta target pattern recognition effectiveness or triggering event frequency.

A positive/negative response sub-system identifies if the external stimuli is positive, negative or neutral. Positive is defined as target pattern identification sub-system of nodes being triggered with a frequency per unit of time, per unit of energy expended by the system or a component of the system, or per occurrence of some other target pattern.

In a machine with a feedback circuit there are four primary ways the threshold amplifier or dampener modifier may be triggered via the secondary input signal of type E nodes and thus any variable part of a node may be adjusted:

1) As a direct response to external stimuli and the activation of specific nodes or a set of nodes in the machine such as a target node set;
2) As a result of random change;
3) As a response to specific output signals from a positive/negative response sub-system based on target pattern recognition/target node set activation; or
4) Direct instruction via human control.

In order to achieve dynamic pattern recognition, it is necessary that a positive/negative response sub-system sends its output signal message to other nodes in the machine, this could be achieved by type E nodes and their additional input receiver(s) and output(s). In such a situation, once an output is given by the positive/negative response sub-system it is fed back through the system via this alternate feedback circuit. One of the input receivers is the input for positive response and the other is for negative. The number of outputs and nodes sending output signals may be any number desired or useful so as long as it is at least one. In the situation where there is only one alternate output, a circuit within the machine may be configured such that if an input signal or message is received in the positive or negative input, the output will adjust the direction it sends to have the desired impact on another node, node set, or the machine as a whole.

By giving positive and negative feedback to certain stimuli, or by defining the rules by which the sub-systems gives positive or negative feedback via the initial configuration of the feedback loop node set, the patterns become dynamic in the behavior of the machine. As the machine does not know what it is doing, certain stimuli patterns simply result in positive or negative responses. Positive or negative response may thus be configured such that new patterns will be identified by the behavior of the machine and it will become better as it seeks the positive response configured as its target collection of patterns.

One practical implementation of this would be a machine designed to find gold. For the ease of description, consider in a simplified version of our planet. In this situation, the machine operates on an endless underground plain comprised of dirt and the minerals quartz and gold. In this scenario, gold is always surrounded on all sides with particulate gold. Particulate quartz and gold are present in the dirt in increasing proportion to their proximity to quartz and gold deposits indicated by a square only containing Q or G respectively.

An example of a 10×10 sample of this plane is illustrated schematically in FIG. 11.

The machine is configured with a target patterns node set for particulate gold and gold. It also has dynamic memory node sets. In this particular situation, a positive response feedback loop would be built into the initial configuration of nodes and thus be exhibited by the machine's behavior over time.

When its' various input stimuli node sets trigger its pattern detection node set for gold it moves towards the strongest signal of particulate gold or gold.

It learns to detect patterns associated with gold but that are not gold by dynamically storing a larger pattern of detected inputs that occurred immediately prior to encountering gold. In this example, the machine will record quartz preceding finding gold because its feedback loop will store its encounter with quartz prior to each discovery of gold. In this dynamic configuration the machine will 'learn' to pursue quartz as well as gold.

Based on four input sensory node sets, the machine "sees" the four squares immediately surrounding it and is drawn to the minerals that trigger its single initial stored target pattern and therefor with which it has a positive association. Initially this is limited to gold. As the machine moves around, it will occasionally find gold. Every time the machine finds gold it stores the substance of the square it was in immediately previously and will grow a positive association with this mineral/substance as well as gold.

The machine consists of the following components/subsystems:
1) Four input sensors with which it identifies the surrounding minerals.
2) A target node set for gold.
3) An imprint memory sub-system which store the sensory input patterns of the non-gold minerals it encounters configured to store what it is encountered immediately prior to finding gold.
4) A comparison/identification sub-system which identifies the substances in the adjacent blocks, if it is not yet catalogued it creates a new imprint memory.
5) A positive association feedback sub-system connected to these dynamic pattern storage.
6) A decision sub-system, this sub-system stores the associations/tendencies towards different minerals and directs motorized movement based on the greatest signal strength.

What amounts to a decision is made by the machine for which way to move in the following way, the four surrounding minerals are identified and each sends a signal to the decision sub-system. The strongest of the signals is the direction in which the machine will travel. By default, gold will have the strongest signal so if gold is in one of the adjacent spaces it will always choose that direction.

Parallel to this decision making process, if gold is in the currently occupied spot, the positive association sub-system will send a signal to the comparison/identification subsystem and identify which mineral was in the space prior. The positive association sub-system will then send a signal down the alternate feedback circuit to the imprint memory sub-system and adjust the output of the corresponding sub-system to be stronger.

In such a situation, over time, the machine will grow a 'positive association' with quartz, by increasing its output strength and will seek out quarts if it is in the adjacent square. In the behavior of the machine, the pattern of quarts always being next to gold may be inferred or learned.

In a situation where the positive and negative response prompts are more insular or abstract, a machine embodying such characteristics will then also be capable of representing more complex patterns in its behavior.

Complex Node Type G

A complex node type "G" may be constructed from any node of any type with the addition of a computational device such as a CPU or an integrated circuit board or computer control board inclusive of CPU and memory.

Machines incorporating complex node type G will have further flexibility and may readily achieve more complex tasks.

In some embodiments, the above described nodes and sub-systems may form the basic components of neural emulating computer systems.

Where any or all of the terms "comprise", "comprises", "comprised" or "comprising" are used in this specification (including the claims) they are to be interpreted as specifying the presence of the stated features, integers, steps or components, but not precluding the presence of one or more other features, integers, steps or components.

While the invention has been described in conjunction with a limited number of embodiments, it will be appreciated by those skilled in the art that many alternative, modifications and variations in light of the foregoing description are possible. Accordingly, this disclosure is intended to embrace all such alternative, modifications and variations as may fall within the spirit and scope of the invention as disclosed.

The invention claimed is:

1. A node configured to function as a component in a dynamic node based computer, the node based computer including a plurality of nodes, wherein at least a subset of the nodes are arranged in a predefined spatial arrangement with nodes at known positions, the node comprising:
a signal receiver configured to detect or receive one or more input signals from one or more signal sources,
a signal transmitter configured to selectively connect and generate or transmit signals to selected ones of other nodes via specifically targeted or direction specific transmission; and
a threshold device configured to dynamically control the selective connecting and transmitting of the signal transmitter to selected ones of the other nodes across the spatial arrangement based on a threshold that is based on one or more characteristics of the input signals to thereby define a spatial pattern of connections between the node and other nodes, wherein the specific connections between the spatial pattern of connected nodes represent a store of information or a process.

2. The node according to claim 1, wherein the characteristics of the input signals include one or more of: a direction, an intensity, an amplitude, a period, a frequency, and a waveform.

3. The node according to claim 1, wherein the threshold is based on one or more characteristics of the input signals of multiple input signals.

4. The node according to claim 1, wherein the threshold device is configured to dynamically adjust the threshold based on the one or more characteristics of the input signals.

5. The node according to claim 1, wherein the signal receiver is configured to alter a direction from which input signals are received.

6. The node according to claim 1, wherein the signal sources provide input signals from one or more sensors and/or detectors, including one or more of a light detector, a color sensor, a sound detector, a chemical sensor, and a motion sensor.

7. The node according to claim 1, further comprising:
an output stage device configured to provide a transmitted signal to an external actionable or controllable device, wherein the actionable or controllable device is one of a motor, a switch, or a computer.

8. The node according to claim 1, wherein the signal sources provide the transmitted signals from other nodes.

9. The node according to claim 1, further comprising:
a signal control device configured to dynamically alter one or more characteristics of a transmitted signal.

10. The node according to claim 9, wherein the signal control device is configured to dynamically alter one or more of a direction, an intensity, an amplitude, a period, a frequency, and a waveform of the transmitted signals.

11. The node according to claim 1, further comprising a control device configured to selectively adjust parameters of the threshold device.

12. The node according to claim 1, comprising one or more dynamic amplifiers operatively coupled to the signal receiver and/or the signal transmitter.

13. The node according to claim 1, further comprising one or more dynamic signal dampeners operatively coupled to the signal receiver and/or the signal transmitter.

14. A system comprising a plurality of nodes, with at least a subset of the nodes arranged in a predefined spatial arrangement of nodes at known positions, each node comprising:
a signal receiver configured to detect or receive one or more input signals from one or more signal sources, including other nodes,
a signal transmitter configured to selectively connect and generate or transmit signals to selected ones of other nodes in the spatial arrangement via specifically targeted or direction specific transmission;
a threshold device configured to dynamically control the selective connecting and transmitting of the signal transmitter to selected ones of the other nodes in the spatial arrangement based on a threshold that is based on one or more characteristics of the input signals to thereby define a spatial pattern of connections between the node and other nodes, wherein the specific connections between the spatial pattern of connected nodes represent a store of information or a process; and
a signal control device configured to dynamically alter one or more characteristics of a transmitted signal,
wherein one or more of the plurality of nodes include pre-determined initial thresholds.

15. The system according to claim 14, wherein the plurality of nodes include pre-determined initial transmitted signal characteristics.

16. The system according to claim 14, wherein the threshold device and/or the signal control device are configured such that one or more specific patterns of inputs signals trigger an output signal from the plurality of nodes.

17. The system according to claim 16, wherein the threshold device and/or the signal control device are configured to recognize a pattern of input signals and to generate a predicted pattern of stimuli next expected to be observed.

18. The system according to claim 16, wherein the threshold device and/or the signal control device are configured to seek an outcome state and to modify the threshold and output signals to ensure targeted input signals or patterns of targeted input signals closely match a defined or programmed target state.

19. The system according to claim 14, wherein the plurality of nodes is configured as a plurality of sub-systems and one or more of the plurality of sub-systems are configured via starting connections and node thresholds to detect a specific pattern of input signals either from external sensors or detectors or in the form of a pattern of other activated nodes or sub-systems.

20. The system according to claim 14, wherein one or more of the sub-systems are configured to perform operations including:
storing input signals present at a time of, or leading up to a time at which a pre-determined pattern is recognized thereby triggering a sub-system;
directing new nodal or modular connections such that additional patterns result in similar or different outputs;
rewarding, pursuing, directing, or optimizing specific types of outcomes for sub-systems or the system in the form of more frequent detection of patterns of stimuli or inputs, patterns of firing or signals from connections of nodes and or sub-systems within the system, or optimized performance of the parts or all of the system; and
performing a specific task.

21. The system according to claim 19, wherein one or more of the sub-systems are configured to compare performance of a sub-system to other sub-systems and to prompt alterations, either random or based on previously stored alterations that have produced improved results, to sub-system connections, triggering input patterns, thresholds, or response patterns.

* * * * *